United States Patent
Abe et al.

(10) Patent No.: US 11,443,917 B2
(45) Date of Patent: Sep. 13, 2022

(54) IMAGE GENERATION METHOD, NON-TRANSITORY COMPUTER-READABLE MEDIUM, AND SYSTEM

(71) Applicant: Hitachi High-Tech Corporation, Tokyo (JP)

(72) Inventors: Chikako Abe, Tokyo (JP); Hitoshi Sugahara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 304 days.

(21) Appl. No.: 16/891,842

(22) Filed: Jun. 3, 2020

(65) Prior Publication Data
US 2021/0043418 A1 Feb. 11, 2021

(30) Foreign Application Priority Data
Aug. 7, 2019 (JP) .............................. JP2019-145052

(51) Int. Cl.
*H01J 37/28* (2006.01)
*H01J 37/26* (2006.01)
(Continued)

(52) U.S. Cl.
CPC .............. *H01J 37/28* (2013.01); *G06N 20/00* (2019.01); *H01J 37/244* (2013.01);
(Continued)

(58) Field of Classification Search
CPC ........ H01J 37/28; H01J 37/244; H01J 37/261; H01J 2237/24495; H01J 2237/2801;
(Continued)

(56) References Cited

U.S. PATENT DOCUMENTS

2003/0058435 A1\* 3/2003 Honda ............... G01N 21/9501
356/237.1
2006/0284081 A1\* 12/2006 Miyamoto ............ H01J 37/153
250/307
(Continued)

FOREIGN PATENT DOCUMENTS

JP 62-43050 A 2/1987
JP 4035974 B2 1/2008
(Continued)

OTHER PUBLICATIONS

Korean-language Office Action issued in Korean Application No. 10-2020-0064771 dated May 21, 2021 with English translation (six (6) pages).
(Continued)

*Primary Examiner* — David A Vanore
(74) *Attorney, Agent, or Firm* — Crowell & Moring LLP

(57) ABSTRACT

The present invention relates to an image generation method for an objective for generating an image corresponding to a multi-frame image from image signals obtained by scanning a small number of frames are proposed. To achieve the above objective, there is proposed a method of performing two-dimensionally scanning on an object on a sample with a beam a plurality of times, generating a first image by integrating image signals obtained by a plurality of times of scanning at a first timing among the image signals generated based on the plurality of times of the two-dimensional scanning (S103), generating a second image based on the smaller number of times of scanning than the number of times of scanning at the first timing including scanning after the first timing (S105), training a learning device by using teacher data with the second image as an input and the first image as an output (S108), and inputting input image signals obtained by the smaller number of times of scanning than the
(Continued)

number of times of scanning at the first timing to the trained learning device to output an estimated image.

6 Claims, 9 Drawing Sheets

(51) Int. Cl.
    *H01J 37/244*     (2006.01)
    *G06N 20/00*     (2019.01)

(52) U.S. Cl.
    CPC ... *H01J 37/261* (2013.01); *H01J 2237/24495* (2013.01); *H01J 2237/2801* (2013.01); *H01J 2237/2803* (2013.01)

(58) Field of Classification Search
    CPC ............. H01J 2237/2803; H01J 37/222; H01J 2237/226; G06N 20/00; G06N 3/0454; G06N 3/08; G01N 23/2251; G01N 2223/418
    See application file for complete search history.

(56) References Cited

U.S. PATENT DOCUMENTS

| | | | |
|---|---|---|---|
| 2009/0222753 A1* | 9/2009 | Yamaguchi | G06T 7/0004 702/35 |
| 2013/0140457 A1* | 6/2013 | Minekawa | G01N 23/22 250/307 |
| 2015/0036914 A1* | 2/2015 | Sekiguchi | B82Y 40/00 382/149 |
| 2015/0294457 A1 | 10/2015 | Maeda et al. | |
| 2018/0240225 A1 | 8/2018 | Harada et al. | |
| 2019/0228522 A1* | 7/2019 | Shinoda | G06N 3/0454 |
| 2019/0362189 A1* | 11/2019 | Uematsu | H01J 37/222 |
| 2019/0383753 A1* | 12/2019 | Zhang | G06T 7/174 |
| 2020/0018944 A1* | 1/2020 | Fang | G06N 3/0454 |
| 2020/0051781 A1* | 2/2020 | Fujimura | G06N 3/10 |
| 2020/0111206 A1* | 4/2020 | Yati | G06K 9/6267 |
| 2020/0160497 A1* | 5/2020 | Shah | G06T 7/001 |
| 2020/0184628 A1* | 6/2020 | Bhattacharyya | G06T 7/0004 |
| 2020/0211178 A1* | 7/2020 | Zhou | G06T 7/0006 |
| 2021/0026338 A1* | 1/2021 | Yati | G05B 19/41875 |
| 2021/0027445 A1* | 1/2021 | Plihal | G06T 7/001 |

FOREIGN PATENT DOCUMENTS

| | | |
|---|---|---|
| JP | 2013-93251 A | 5/2013 |
| JP | 5542478 B2 | 7/2014 |
| JP | 2019-129169 A | 8/2019 |
| KR | 10-2014-0035511 A | 3/2014 |
| TW | 201843692 A | 12/2018 |
| WO | WO 2014/069558 A1 | 5/2014 |

OTHER PUBLICATIONS

Taiwanese-language Office Action issued in Taiwanese Application No. 109119262 dated Mar. 17, 2021 (eight (8) pages).
Korean-language Notice of Allowance issued in Korean Application No. 10-2020-0064771 dated Nov. 29, 2021 with partial English translation (three (3) pages).

* cited by examiner

[FIG. 1]
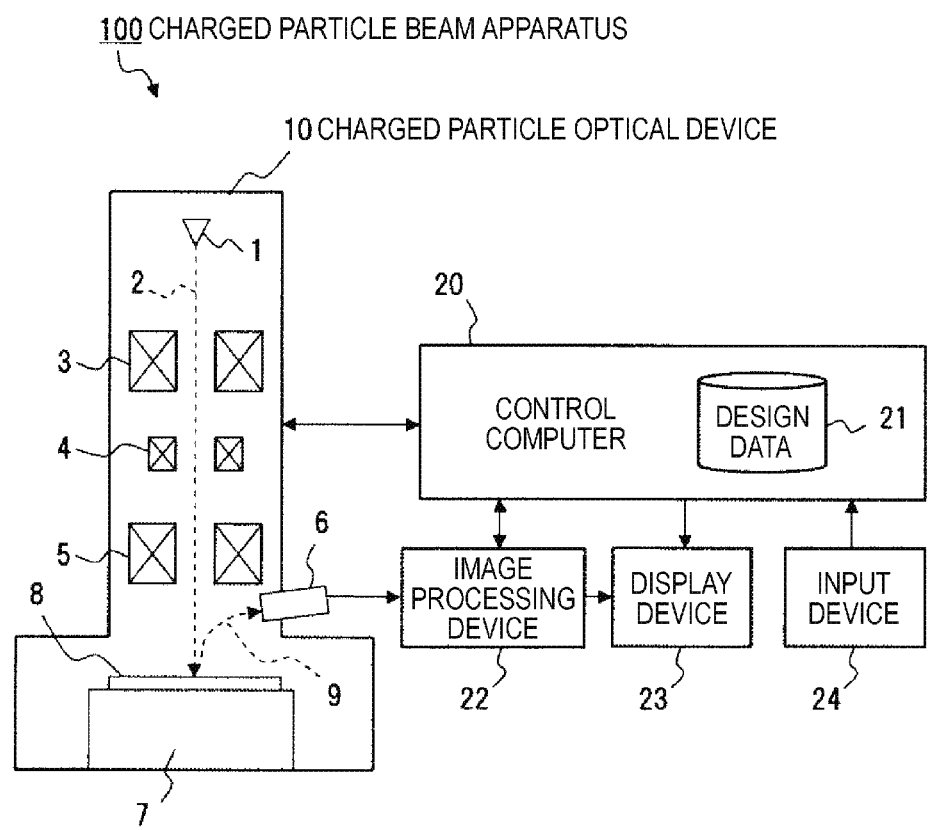

[FIG. 2]
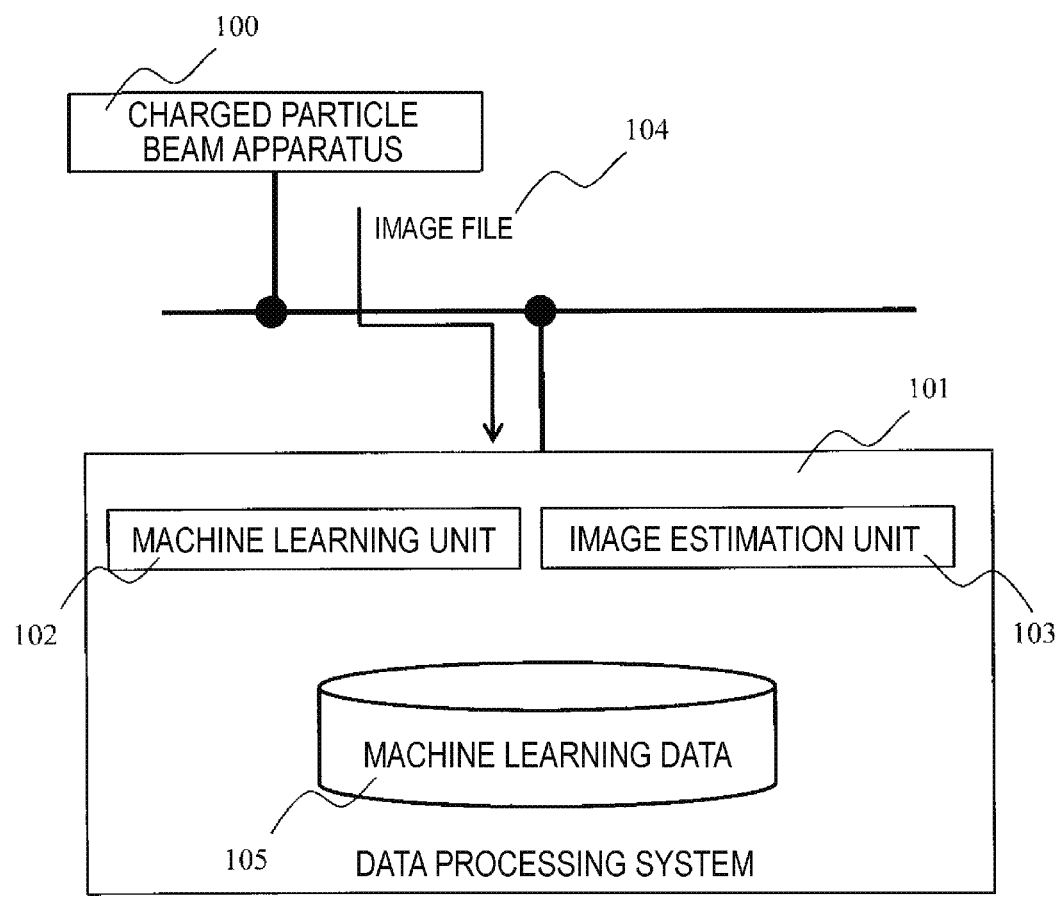

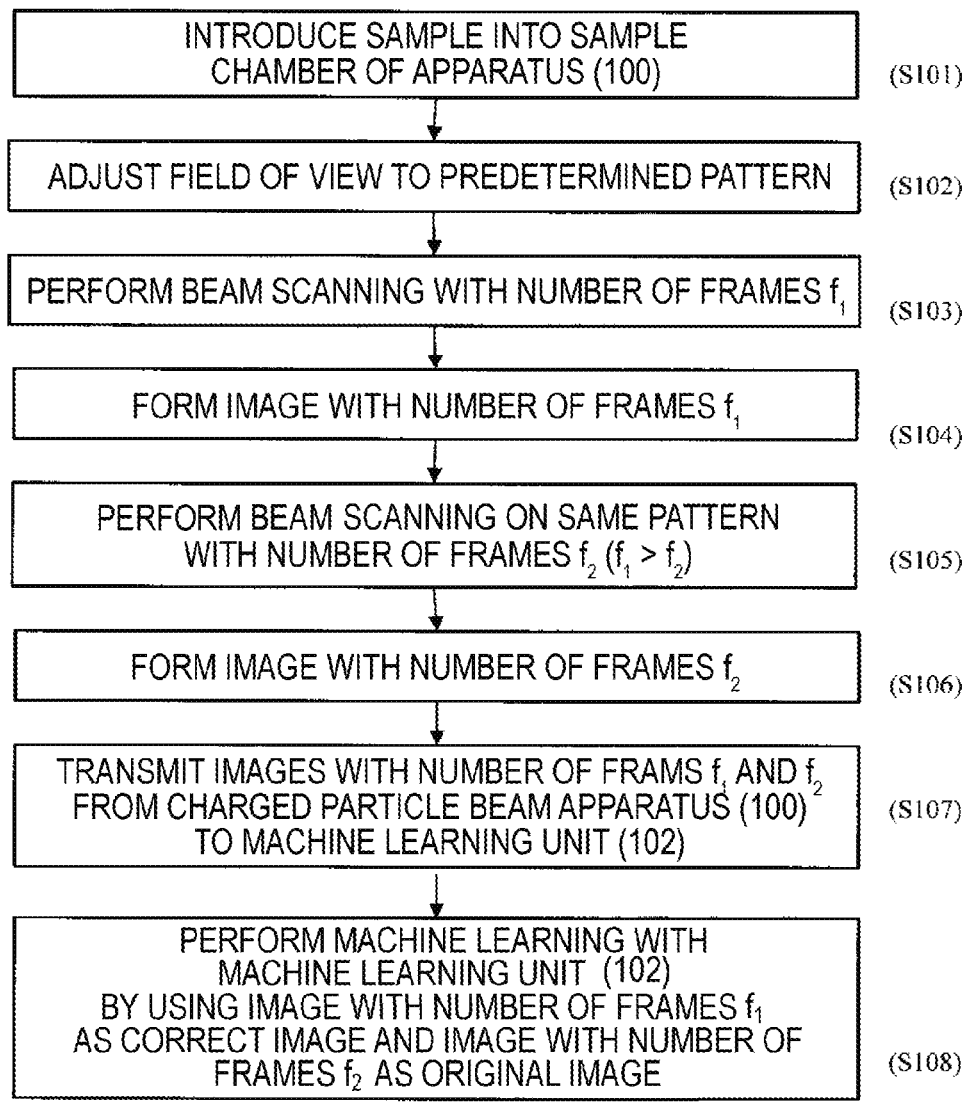

[FIG. 4]
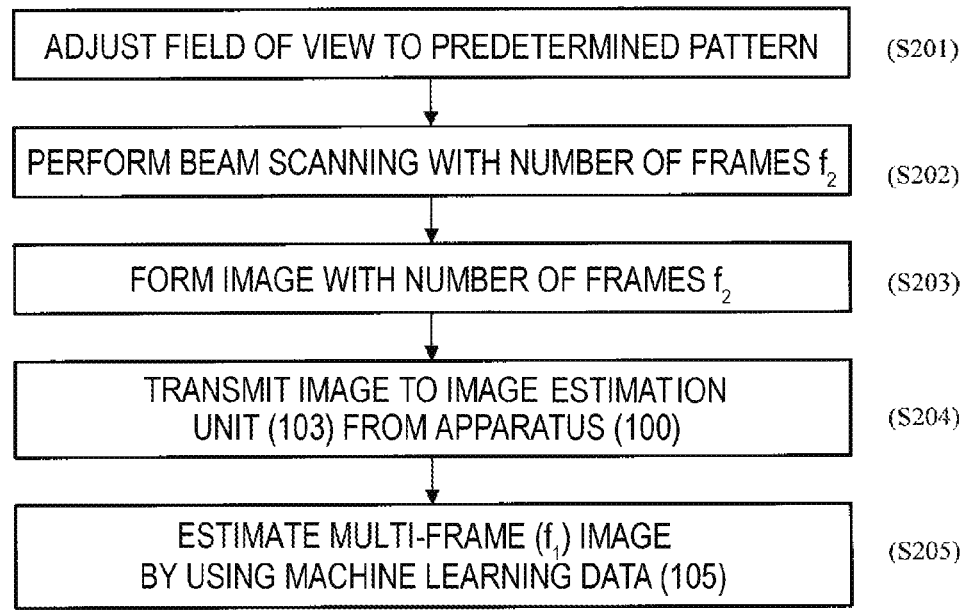

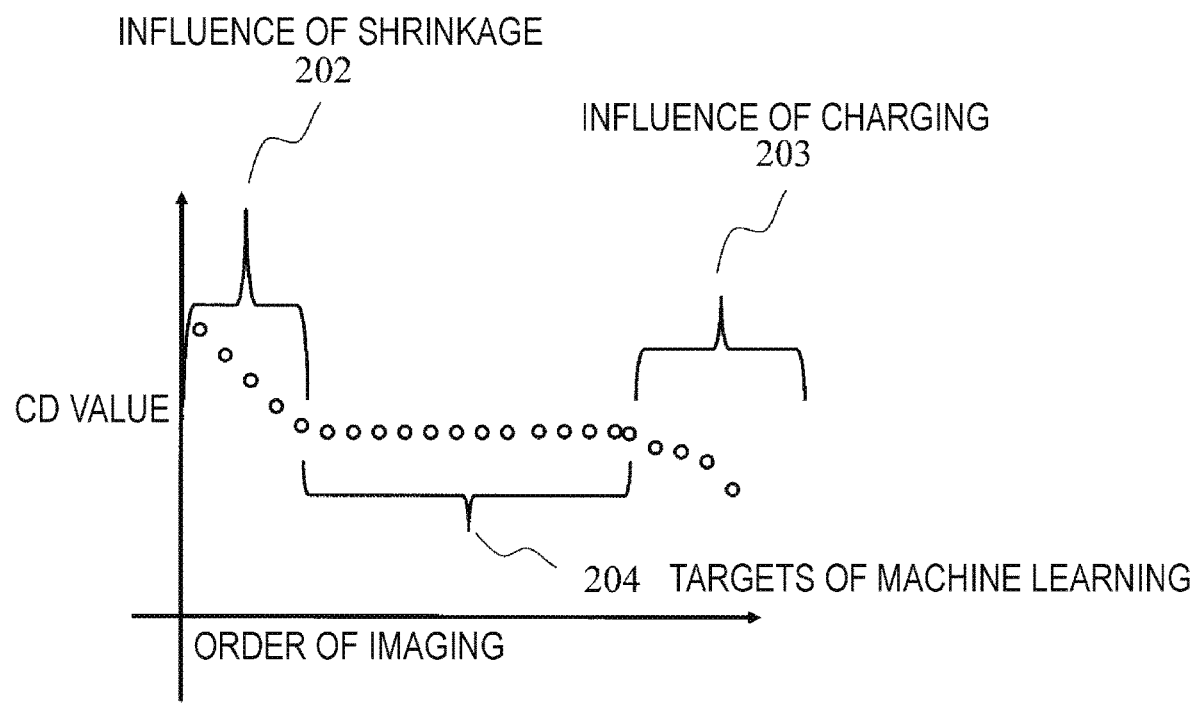

[FIG. 6]
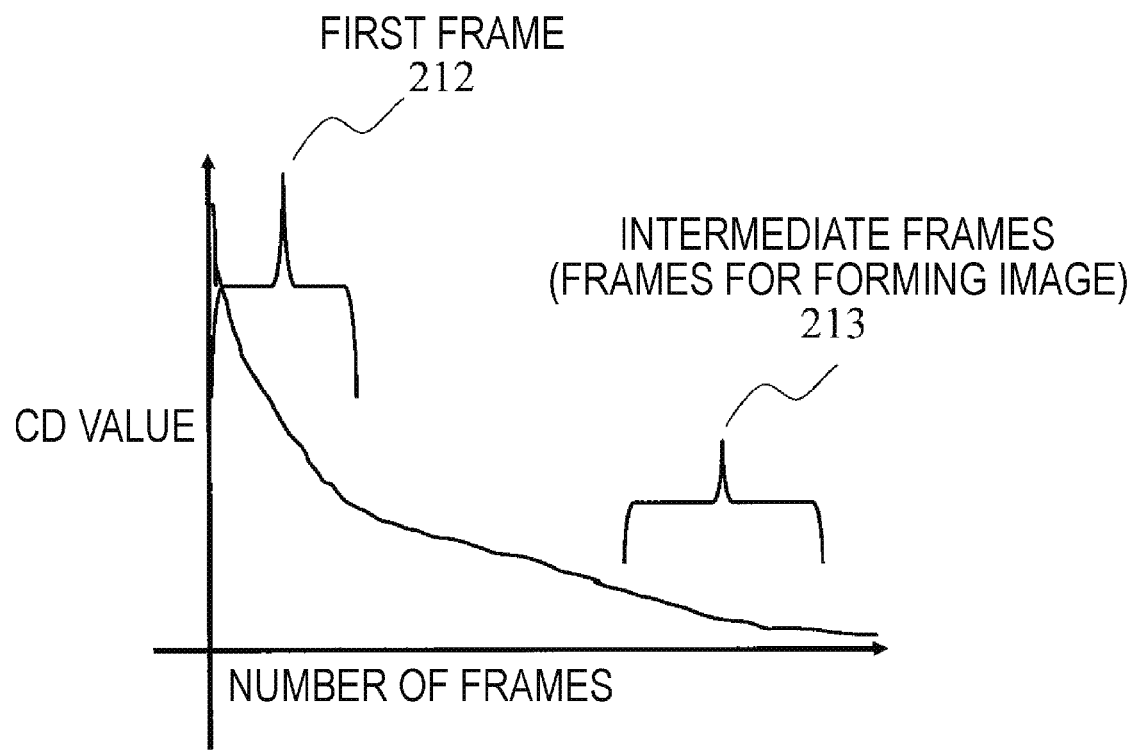

[FIG. 7]
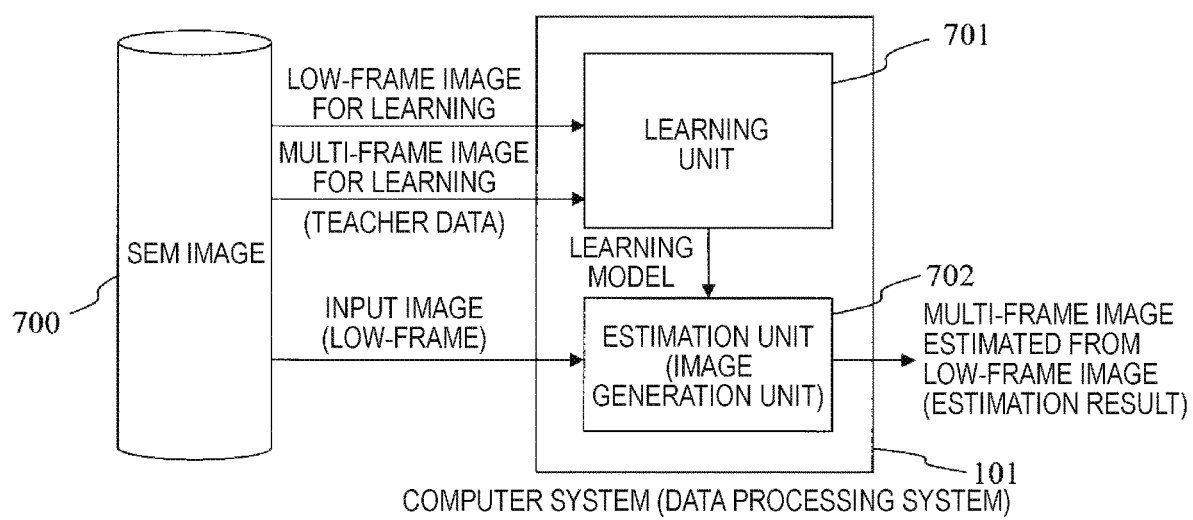

[FIG. 8]
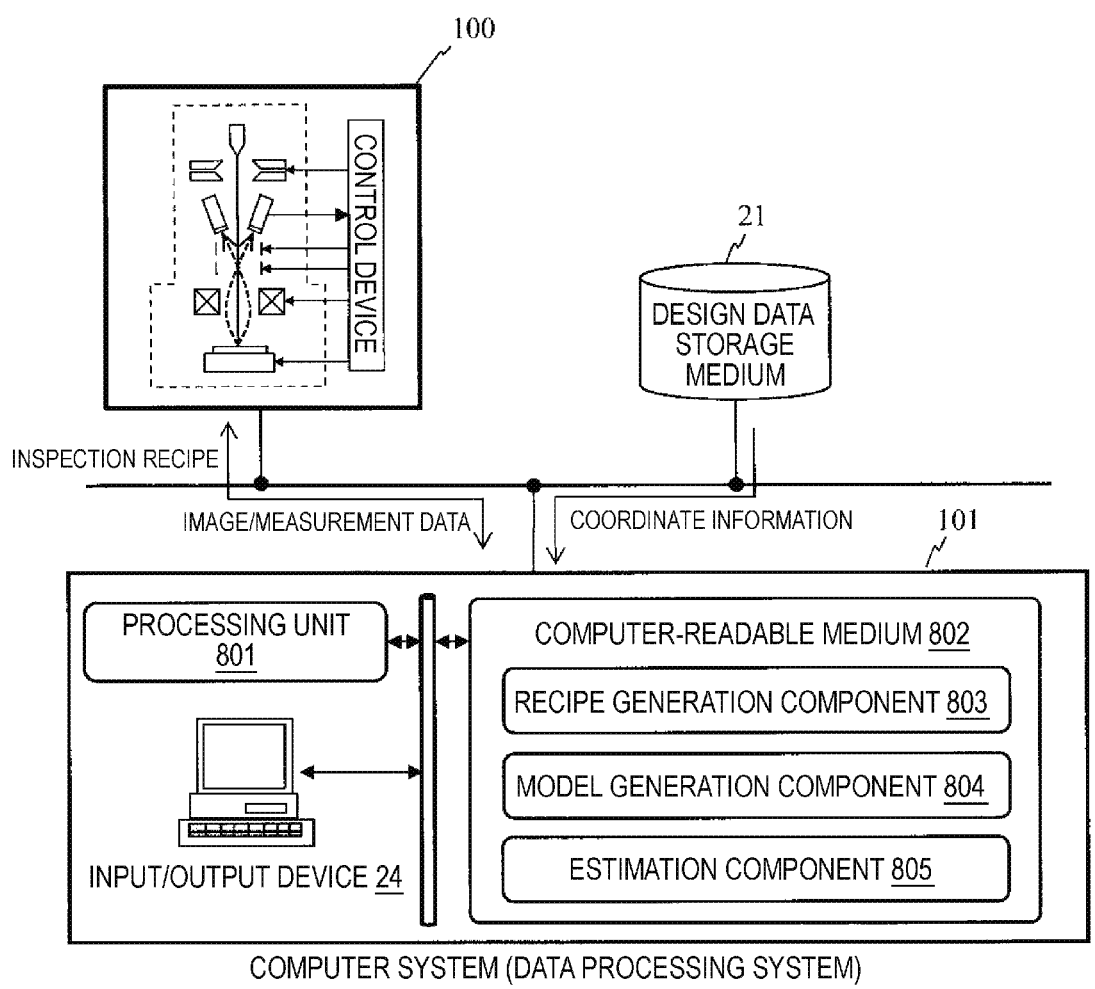

[FIG. 9]
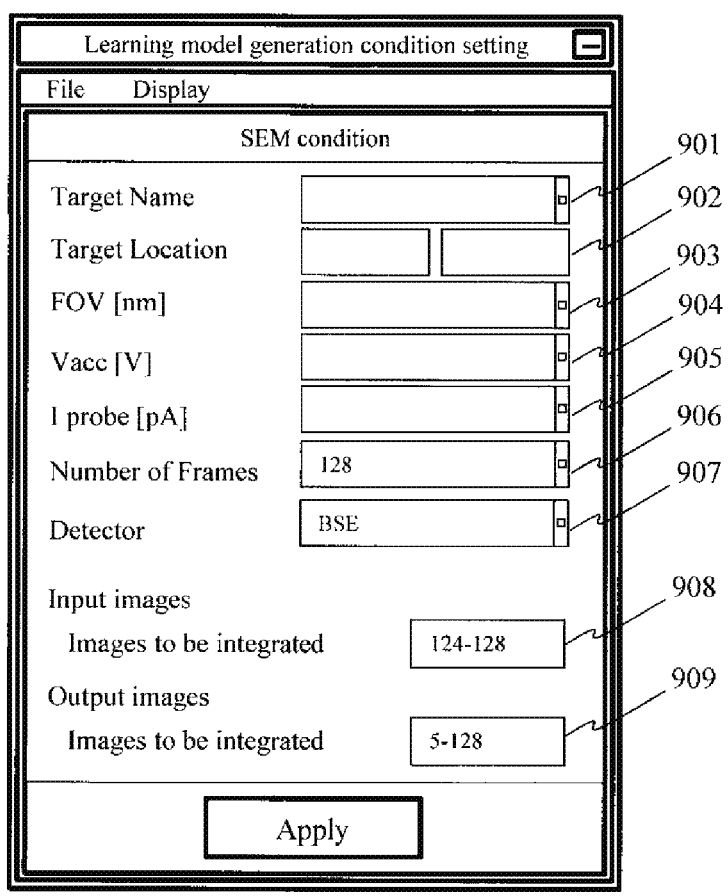

IMAGE GENERATION METHOD, NON-TRANSITORY COMPUTER-READABLE MEDIUM, AND SYSTEM

TECHNICAL FIELD

The present invention relates to a method and system for generating an image, and more particularly to a method and system for generating an image by estimation using machine learning.

BACKGROUND ART

As a background art in this technical field, there is disclosed in WO2014/069558 (PTL 1). PTL 1 discloses an ultrasonic diagnostic apparatus that generates a high-density image by inputting low-density image data obtained by scanning an ultrasonic beam (transmitting beam and receiving beam) at low density to a high-density processing unit that has learned about a high-density image.

CITATION LIST

Patent Literature

PTL 1: WO2014/069558 (Corresponding US Patent Publication US2015/0294457)

SUMMARY OF INVENTION

Technical Problem

A charged particle beam apparatus such as an electron microscope irradiates a sample with charged particles such as electrons and ions. An electron microscope is an apparatus that generates an image based on the detection of secondary electrons and the like generated by irradiating a sample with an electron beam. In order to generate a high-resolution image by such an apparatus, a method of integrating image signals obtained by performing two-dimensional scanning (frame scanning) of an electron beam a plurality of times is known. The integration is a method of performing a plurality of times of scanning in a scanning area, averaging image signals obtained by the scanning, and obtaining an output image. On the other hand, if the electron beam is excessively scanned, a structure (for example, a pattern formed on a semiconductor wafer) on the sample may shrink, and therefore, from the viewpoint of suppressing damage to the sample, it is desirable to perform beam scanning with a small number of frames. PTL 1 does not mention anything about estimating an image based on the output of a charged particle beam apparatus such as an electron microscope.

Hereinafter, an image generation method, a non-transitory computer-readable medium, and system for generating an image corresponding to a multi-frame image from image signals obtained by scanning a small number of frames are proposed.

Solution to Problem

As one aspect for achieving the above object, there is proposed an image generation method for integrating image signals obtained by beam scanning to generate an integrated image, the method including: performing two-dimensionally scanning on an object on a sample with a beam a plurality of times by using a deflector provided in a charged particle beam apparatus; detecting charged particles obtained by the plurality of times of two-dimensional scanning by using a detector provided in the charged particle beam apparatus; generating a first image by integrating the image signals obtained by a plurality of times of scanning at a first timing among the image signals generated based on the detecting; generating a second image based on the smaller number of times of scanning than the number of times of scanning at the first timing including at least one time of scanning after the first timing and the scanning after the plurality of times of scanning within the first timing; training a learning device by using teacher data with the second image as an input and the first image as an output; and inputting input image signals obtained by the smaller number of times of scanning than the number of times of scanning at the first timing to the trained learning device to output an estimated image.

Further, as another aspect for achieving the above object, there is proposed a non-transitory computer-readable medium having stored therein program instructions executable on a computer system to perform a computer-executed method for generating an image based on an output of a charged particle beam apparatus, the computer-executed method including: a step of performing two-dimensional scanning on an object on a sample with a beam a plurality of times by using a deflector provided in the image generation tool, by a deflector provided in the image generation tool, detecting charged particles obtained by the plurality of times of two-dimensional scanning by using a detector provided in the charged particle beam apparatus, and receiving a first image generated by integrating the image signals obtained by a plurality of times of scanning at a first timing among the image signals generated based on the detecting; a step of receiving a second image generated based on the smaller number of times of scanning than the number of times of scanning at the first timing including at least one time of scanning after the plurality of times of scanning at the first timing, after the first timing; a step of training a learning device by using teacher data with the second image as an input and the first image as an output; and a step of inputting image signals obtained by the smaller number of times of scanning than the number of times of scanning at the first timing to the trained learning device to output an estimated image.

As still another aspect for achieving the above object, there is proposed system that generates an image of an object of a sample from data obtained by a charged particle beam apparatus, including a computer system and components executed by the computer system, in which the computer system includes a learning device that outputs an estimated image, the learning device is trained in advance by using teacher data with a first image generated by integrating the image signals obtained by a plurality of times of scanning at a first timing among the image signals obtained by performing the two-dimensional scanning a plurality of times by the charged particle beam apparatus as an input, and a second image generated based on the smaller number of times of scanning than the number of times of scanning at the first timing including at least one time of scanning after the plurality of times of scanning at the first timing, after the first timing as an input, and the component inputs image signals obtained by the smaller number of times of scanning than the number of times of scanning at the first timing to the trained learning device to output an estimated image.

Advantageous Effects of Invention

According to the above-described method and the like, it is possible to estimate an image with a small amount of beam irradiation while suppressing the influence of an event generated due to beam irradiation, such as shrinkage, on the image.

BRIEF DESCRIPTION OF DRAWINGS

FIG. 1 is a diagram illustrating an outline of a scanning electron microscope.

FIG. 2 is a diagram illustrating an outline of an image estimation system (data processing system).

FIG. 3 is a flowchart illustrating a process of training a learning device by using image data obtained by a plurality of times of two-dimensional scanning.

FIG. 4 is a flowchart illustrating a process of performing image estimation by using the trained learning device.

FIG. 5 is a diagram illustrating an acquisition timing of images to be subjected to machine learning.

FIG. 6 is a diagram illustrating an acquisition timing of images to be subjected to machine learning.

FIG. 7 is a diagram illustrating an example of a computer system including the learning device.

FIG. 8 is a diagram illustrating an example of the image estimation system including an image generation tool.

FIG. 9 is a diagram illustrating an example of a graphical user interface (GUI) screen for setting learning conditions of the learning device.

DESCRIPTION OF EMBODIMENTS

Hereinafter, for example, a method, a non-transitory computer-readable medium, system, and the like for performing a large number (m) of times of beam scanning (multi-frame scanning) on a sample by using a charged particle beam apparatus, and then performing a small number (n) of times of beam scanning (low-frame scanning) (<m) on the sample and training a learning device by using images generated by the multi-frame scanning and images generated by the low-frame scanning as teacher data to generate an estimated image by using the trained learning device, will be described.

A charged particle beam apparatus represented by a scanning electron microscope (SEM) is an apparatus that detects charged particles (secondary electrons and the like) obtained by scanning a sample with a charged particle beam such as an electron beam and forms an image.

A desired position of the sample can be inspected by placing the sample on a sample stage called a stage and deflecting charged particles with the movement of the stage. In particular, in SEMs for measuring and inspecting semiconductors, in order to measure a circuit pattern existing at a desired position on a semiconductor device, a program that stores operation conditions of the apparatus called a recipe is created in advance, and measurement and inspection are performed based on the conditions set in the recipe. Charged particle beam apparatuses have high magnification and high measurement reproducibility, and new applications and requirements have arisen including not only simple length measurement and pitch measurement, but also proposing indicators that evaluate the performance of a pattern in an image. In addition, miniaturization has progressed, and the need for measuring a wider area at multiple points has been increasing.

A scanning electron microscope is provided with a deflector for two-dimensionally scanning a beam on a sample, and further provided with an image processing system that integrates image data obtained by performing two-dimensional scanning a plurality of times. By integrating the image data obtained by multi-frame scanning, it is possible to generate an image with a high SN ratio in which noise is relatively suppressed with respect to the integrated image obtained by low-frame scanning.

On the other hand, as the number of frames increases, the time required for scanning increases. For example, when measuring or inspecting a large number of patterns formed on a semiconductor wafer, the scanning time increases in proportion to the number of measurement points. Further, depending on the type of the pattern, some patterns are shrunk or charged by the irradiation of the beam, and from the viewpoint of the influence on the sample, the smaller the number of frames, the better.

Mainly, in the field of semiconductor measurement and inspection, as the miniaturization of patterns progresses, the need for multi-point measurement in a wider area is increasing. Although multi-frame images are suitable for performing high-accuracy measurement, as described above, the throughput is greatly lowered and the influence of shrinkage is large. If a multi-frame image that can suppress shrinkage and the like can be obtained without lowering the throughput, high-speed, high-precision measurement and inspection can be performed.

In the embodiment described below, mainly a method of acquiring teacher data for training a learning device by performing beam scanning for generating low-frame images after performing beam scanning for generating multi-frame images, training the learning device by using the teacher data, and estimating an image corresponding to the multi-frame image from the low-frame image by using the learning device will be described.

Since the multi-frame image and the low-frame image included in the teacher data as described above can be regarded as having the same influence of the shrinkage caused by the beam scanning, machine learning is performed by using the multi-frame image as a correct image (an output such as convolutional neural network (CNN)) and deep neural network (CNN)) and the low-frame image as an original image (an input such as CNN and DNN). According to the trained learning device, it is possible to estimate an image obtained by multi-frame scanning from low-frame images.

High-precision measurement and inspection can be performed while suppressing a decrease in throughput by performing low-frame imaging after multi-frame imaging and performing machine learning using a multi-frame image as a correct image and a low-frame image as an original image.

EXAMPLE

Hereinafter, a method, a non-transitory computer-readable medium, and system for estimating a multi-frame image from a low-frame image will be described with reference to drawings.

FIG. 1 is a diagram illustrating a configuration example of a charged particle beam apparatus. As illustrated in FIG. 1, a charged particle beam apparatus 100 roughly includes a charged particle optical device 10 and a control computer 20. The charged particle optical device 10 includes a charged particle source 1, a focusing lens 3, a deflector 4, an objective lens 5, a secondary electron detector 6, and the like.

A charged particle beam 2 emitted from the charged particle source 1 is focused by the focusing lens 3, further scanned and deflected by the deflector 4, and focused on the surface of a sample 8 by the objective lens 5. The sample 8 is mounted on a sample stage 7.

The scanning of the charged particle beam 2 emits secondary electrons 9 or backscattered electrons from the sample by the deflector 4, and these electrons are detected by the secondary electron detector 6 (or a backscattered electron detector (not illustrated).

Then, the secondary electrons 9 detected by the secondary electron detector 6 are converted into light by a scintillator provided in the secondary electron detector 6, and guided to a photomultiplier tube through a light guide, where the secondary electrons are converted into photoelectrons according to the light intensity, and then collide with a dynode. The dynode is an electrode coated with a substance having a high secondary electron emission efficiency, and can amplify a secondary electron signal. The amplified signal is taken out as a signal current (detection signal). Further, the detection signal is transmitted to an image processing device 22 via an amplifier (not illustrated), an A/D (Analog to Digital) converter, and the like. The image processing device 22 generates an image based on the secondary electrons 9 on the surface of the sample 8 as an observation image, based on the detection signal from the secondary electron detector 6 and the scanning control signal of the deflector 4 and displays the generated observation image on a display device 23.

The control computer 20 has a storage device that stores information including design data 21 (for example, layout data generated based on CAD data or design data) on a pattern design of the sample 8, and is connected to an image processing device 22, a display device 23, an input device 24 such as a keyboard, a mouse, and the like, further connected to the charged particle optical device 10 via a control device which is not illustrated.

At this time, the control computer 20 acquires various information (observation area, magnification, brightness, and the like) for acquiring an observation image input by a user via the input device 24 and controls the operations of the charged particle source 1, the focusing lens 3, the deflector 4, the objective lens 5, the sample stage 7 in the charged particle optical device 10 via the above-described control device (not illustrated), based on the information. In addition, the control computer 20 further processes the observation image generated by the image processing device 22 to generate an image for more advanced observation, length measurement, and inspection and output the result to the display device 23.

The image processing device 22 integrates the image signals obtained by a plurality of times of scanning, generates an integrated image, and displays the integrated image on the display device 23.

FIG. 2 is a diagram illustrating an example of system including the charged particle beam apparatus 100 (image generation tool) and a data processing system 101. The charged particle beam apparatus 100 and the data processing system 101 are connected by, for example, a LAN. The data processing system 101 includes a machine learning unit 102 and an image estimation unit 103. The image file 104 is transferred from the charged particle beam apparatus 100 to the data processing system 101. A plurality of charged particle beam apparatuses 100 may be connected to the data processing system 101. The machine learning unit 102 stores machine learning data 105 in the data processing system 101, and the image estimation unit 103 is configured to refer to the machine learning data 105.

The learning process of the learning device (learning model) executed by the charged particle beam apparatus 100 and the machine learning unit 102 will be described with reference to the flowchart illustrated in FIG. 3.

First, a sample is introduced into a sample chamber (vacuum chamber) of an electron microscope (S101), the field of view (FOV) is adjusted to a predetermined pattern (S102), and the beam is scanned with the number of frames $f_1$ (S103) to form an image with the number of frames $f_1$ (S104). Image signals obtained by scanning a plurality of times (a plurality of frames) are integrated to generate an integrated image. What is obtained here is a multi-frame image.

Next, beam scanning is performed with the number of frames $f_2$ ($f_1 > f_2$) (S105), and image formation is performed with the number of frames $f_2$ (S106). Here, the number of times of beam scanning is made smaller than the number of frames in (S103). What is obtained here is a low-frame image.

The machine learning unit 102 included in the data processing system 101 receives the images with the number of frames $f_1$ and $f_2$ transmitted from the charged particle beam apparatus 100 and obtained by synthesizing the image signals obtained based on the two types of scanning. The machine learning unit 102 performs machine learning (S108) by using the image with the number of frames $f_1$ as a correct image (output) and the image with the number of frames $f_2$ as an original image (input). This learning result is stored in the machine learning data 105. There is no particular limitation on the method of transmitting the images with the number of frames $f_1$ and $f_2$ from the charged particle beam apparatus 100 (S107), and various existing transmission techniques can be applied. A set of image data having the number of frames $f_1$ and $f_2$ is stored in a predetermined storage medium as teacher data and is used for training of the learning device.

Next, an image estimation step using the learning device that has been subjected to the above-described training will be described with reference to a flowchart illustrated in FIG. 4. After the sample to be evaluated is introduced into the sample chamber of the charged particle beam apparatus 100, the FOV (scanning area of the electron beam) is positioned on a predetermined target pattern by using the sample stage 7 and a deflector for moving the FOV (S201), and an image with the number of frames $f_2$ is generated by performing beam scanning with the number of frames $f_2$ (if the number of frames is greater than 1, an integrated image is generated) (S202 and 203).

The charged particle beam apparatus 100 transmits the image data obtained by scanning with the number of frames $f_2$ to the image estimation unit 103 (S204). The image with the number of frames $f_2$ is an image with a smaller number of frames than the image with the number of frames $f_1$. This low-frame image is used as an original image (input). The image estimation unit 103 estimates a multi-frame ($f_1$) image from the input original image by using the machine learning data 105 (S205). This estimated image originally corresponds to a multi-frame image obtained by integrating many frame images.

Even if the input image is an image with one or a small number of frames, measurement and inspection can be performed with the same accuracy as measurement and inspection using a multi-frame integrated image.

When generating teacher data (a data set of an input image and an output image), it is desirable to generate an image based on scanning at a timing free of shrinkage and charging caused by beam irradiation. More specifically, it is desirable to generate teacher data from image signals obtained in an imaging step other than an initial step of imaging in which shrinkage occurs and the last step of imaging in which charging is accumulated by the beam irradiation and the influence thereof is considered to be significant. Specifically, for example, it is conceivable to generate an integrated image without (excluding) image signals obtained by scanning the first o frames (o is an integer of 1 or more) during the entire scanning. In addition, it is also conceivable to generate an integrated image without image signals obtained by scanning the last p frames (p is an integer of 1 or more) in the total number of times of scanning.

FIG. 5 is a diagram illustrating a relationship between the number of times of imaging (the order of imaging: X axis) and the dimension value of the pattern (CD value: Y axis). The number of times of imaging is the number of times an image is generated based on the scanning of one or more frames. As illustrated in the drawing, if imaging is repeatedly performed at the same location, pattern shrinkage due to electron beam irradiation occurs in the early stage of the imaging, and the dimension of the pattern gradually decreases (shrinkage generation period 202). Thereafter, the shrinkage stops, but when the number of times of imaging increases and the accumulated charge increases, the beam is deflected by the influence, and the dimension value fluctuates (period 203 in which the influence of the charging is remarkable).

Therefore, by setting a machine learning target period 204 to be a scanning period for generating teacher data, learning data can be acquired without considering the influence of shrinkage and charging.

FIG. 6 is a diagram illustrating a relationship between the number of frames to be integrated and the CD value. As illustrated in FIG. 6, since the fluctuation of the CD value is large in an initial frame 212, it is preferable to generate a correct image from image signals obtained by scanning an intermediate frame 213 in which the fluctuation of the CD value is moderated to some extent. The range for generating the correct image may be expanded in a range where the fluctuation of the CD value is allowable.

FIG. 7 is a diagram illustrating an example of a computer system that generates a learning model from the obtained information and generates a simulation output (for example, a pseudo image) by using the learning model. Also, the computer system 20 outputs a multi-frame image by inputting a low-frame image to the learning model. The computer system 20 functioning as a learning device includes a learning unit 701 that generates a learning model from a set (teacher data) of a low-frame image for learning (the number of frames $f_2$) and a multi-frame image for learning (the number of frames $f_1$ ($>f_2$)) in advance, and an estimation unit 702 that estimates an image corresponding to the multi-frame image from the input low-frame image by using the learning model.

The learning unit 701 generates a data set to be teacher data from first data such as a low-frame image (for example, the number of frames $f_2$) and second data such as a multi-frame image (for example, the number of frames $f_1$ ($>f_2$)), which are stored in a predetermined storage medium or output from a scanning electron microscope or the like, and generates a learning model based on the data set. The estimation unit 702 estimates a multi-frame image from input images (low-frame images) input from outside by using the learning model generated by the learning unit 701.

FIG. 8 is a diagram illustrating an example of an image generation system including the computer system illustrated in FIG. 7. The system illustrated in FIG. 8 includes a computer system 20, an image generation tool 100 (for example, scanning electron microscope) connected via a bus or a network, and a design data storage medium 1004 storing design data such as a semiconductor device and the like. The computer system 20 is configured by one or more computer subsystems.

As exemplified in FIG. 8, the computer system 20 includes a computer-readable medium 802, a processing unit 801 that executes each component stored in the computer-readable medium 802, and an input/output device 24 that inputs conditions necessary for image generation and conditions for acquiring a learning model.

The computer-readable medium 802 stores a recipe generation component 803 that generates an operation program (recipe) for automatically operating the image generation tool 100, a model generation component 804 that generates the above-described learning model, and an estimation component 805 that estimates an image by using the generated model, for example, based on image generation conditions (coordinate information of a beam irradiation position, irradiation condition of an electron beam, and the like) input from the input/output device 24, and the like. The recipe generation component 803 generates a recipe based on image generation conditions input from, for example, a GUI screen or the like displayed on the display device of the input/output device 24.

FIG. 9 is a diagram illustrating an example of a GUI screen displayed on the display screen of the input/output device 25. The GUI screen illustrated in FIG. 9 is configured to set image acquisition conditions for generating a learning model (teacher data for generating a learning model). On the GUI screen, there are provided setting windows (901 and 902) for setting a pattern (target) name to be subjected to image generation and coordinates of the pattern. The recipe generation component 803 reads the coordinates corresponding to the set pattern name from the design data storage medium 21 and sets operation conditions such as a stage or the like such that the FOV of the image generation tool 100 is positioned on the pattern to be subject to image generation. In addition, operating conditions such as a stage and the like may be set based on coordinate data input from the setting window 902.

The setting windows 903, 904, and 905 are provided for setting the size of the FOV (the size of the scanning area) of the electron microscope, the beam acceleration voltage, and the beam current, respectively. The recipe generation component 803 generates a recipe based on these settings, and the control device provided in the image generation tool 100 causes the main body of the scanning electron microscope to scan the beam under the beam conditions set in the recipe.

In addition, the setting window 906 is provided to set the number of frames. The number of frames is the number of times the set FOV is scanned, and as illustrated in FIG. 9, when the number of frames is set to 128, two-dimensional scanning is performed in the same FOV for 128 times. The number of frames is a value proportional to the amount of beam irradiation for the set FOV, and instead of the number of frames, other parameters (for example, irradiation time, dose amount, and number of times of imaging) that change according to the amount of irradiation may be set in the setting column. The image generation tool 100 irradiates the sample with a beam based on a parameter that changes according to the set amount of irradiation.

The setting window 907 is provided for setting the type of the detector built in the charged particle beam apparatus. The image generation tool 100 includes, for example, a secondary electron detector for detecting secondary electrons and a backscattered electron detector for detecting backscattered electrons and performs image generation using one or both detectors as needed. In the example of FIG. 9, the backscattered electron detector is selected, and learning data for machine learning is generated based on the detection of backscattered electrons.

Setting windows 908 and 909 are provided for inputting the number of frames for generating learning image data. The image generation tool 100 generates an integrated image in which image signals for five frames are integrated based on the number of frames (5 frames) and the range (from 124 frames to 128 frames) set in the setting window 908 and stores the integrated image in a predetermined storage medium. In addition, the image generation tool 100 generates an integrated image in which image signals for 124 frames are integrated based on the number of frames (124 frames) and the range (from 5 frames to 128 frames) set in the setting window 909 and stores the integrated image in a predetermined storage medium.

In the GUI screen in FIG. 9, 5 to 128 frames are selected as target frames of scanning (scanning for acquiring output images of teacher data) at the first timing, and 124 to 128 are selected as target frames of scanning (scanning for acquiring input images of teacher data) at the second timing. The computer system 20 constructs a learning model by using the image data set obtained by these two settings as teacher data of the learning device.

One of the conditions for acquiring a data set is that the number of frames for an input image is smaller than the number of frames for an output image. This is to construct a learning model for estimating an image obtained by multi-frame scanning from an image obtained by low-frame scanning.

In addition, an additional condition for acquiring a data set is that scanning for acquiring an output image is followed by scanning for acquiring an input image, and scanning after the plurality of times of scanning in the scanning for acquiring the output image includes at least one time of scanning for acquiring the input image.

The "scanning for acquiring an output image is followed by scanning for acquiring an input image" includes, for example, a case where the total number of frames is 128, and a case where the frames for an output image are set to 1 to 124, and the frames for an input image are set to 125 to 128. In addition, "scanning after the plurality of times of scanning in the scanning for acquiring the output image includes at least one time of scanning for acquiring the input image" includes 124 to 128 frames in 5 to 128 frames (scanning after scanning of 5 to 123 frames) being set as target frames of scanning for the input image when the frames for the output image is set to 5 to 128 as set on the GUI screen in FIG. 9.

The reason why the scanning for acquiring the input image is performed after the scanning for acquiring the output image or in the latter half of the scanning for acquiring the output image is to make the shrinkage state of the pattern caused by the beam irradiation substantially coincide between the output image and the input image. In a state where shrinkage is generated by the scanning of an output image for which multi-frame scanning is performed relative to the input image, it is possible to form an input image and an output image having substantially the same degree of shrinkage by performing image formation based on low-frame scanning.

When a setting different from the above conditions is set on the GUI screen as illustrated in FIG. 9, a warning to that effect or a setting that does not meet the above conditions may be prohibited.

The image generation tool 100 generates an integrated image without the image signals of the unselected frames and stores the integrated image in a predetermined storage medium, and the computer system 20 generates teacher data for training the learning device from the image stored in the storage medium. Specifically, the computer system 20 trains the learning device by using a data set in which the integrated image with 5 frames is input and the integrated image with 124 frames is output as the teacher data.

As described above, as system including an image generation tool that performing two-dimensional scanning of a beam a plurality of times, and a computer system having a learning device trained by teacher data including an image set, an image generation tool generates a first image by integrating the image signals obtained based on a plurality of times of scanning at a first timing among the image signals obtained by the plurality of times of scanning and a second image from an image signal obtained based on at least one time of scanning after the first timing and the scanning after the plurality of times of scanning within the first timing, and the learning device can reproduce the multi-frame image from the low-frame image according to the system in which the first image and the second image are learned as teacher data.

In addition, by reducing the number of times of scanning at the second timing from the first timing, a multi-frame integrated image can be reproduced from the integrated image obtained by low-frame scanning.

REFERENCE SIGNS LIST

1: charged particle source
2: charged particle beam
3: focusing lens
4 deflector
5: objective lens
6: secondary electron detector
7: sample stage
8: sample
9: secondary electron
10: charged particle optical system
20: control computer
21: design data
22: image processing device
23: display device
24: input device (keyboard, mouse, and the like)
100: charged particle beam apparatus
101: data processing system
102: machine learning unit
103: image estimation unit
104: image file
105: machine learning data

The invention claimed is:

1. An image generation method for integrating image signals obtained by beam scanning to generate an integrated image, the method comprising:
   performing two-dimensional scanning on an object on a sample with a beam a plurality of times by using a deflector provided in a charged particle beam apparatus;
   detecting charged particles obtained by the plurality of times of two-dimensional scanning by using a detector provided in the charged particle beam apparatus;
   generating a first image by integrating the image signals obtained by a plurality of times of scanning at a first timing among the image signals generated based on the detecting;

generating a second image based on the smaller number of times of scanning than the number of times of scanning at the first timing including at least one time of scanning after the first timing and the scanning after the plurality of times of scanning within the first timing;

training a learning device by using teacher data with the second image as an input and the first image as an output; and inputting image signals obtained by the smaller number of times of scanning than the number of times of scanning at the first timing to the trained learning device to output an estimated image.

2. The image generation method according to claim 1, further comprising:

generating the first image by excluding at least one of a first time of scanning and a last time of scanning out of the plurality of times of two-dimensional scanning.

3. A non-transitory computer-readable medium having stored therein program instructions executable on a computer system to perform a computer-executed method for generating an image based on an output of a charged particle beam apparatus: wherein the computer-executed method including a step of performing two-dimensional scanning on an object on a sample with a beam a plurality of times by using a deflector provided in the image generation tool, detecting charged particles obtained by the plurality of times of two-dimensional scanning by using a detector provided in the charged particle beam apparatus, and receiving a first image generated by integrating the image signals obtained by a plurality of times of scanning at a first timing among the image signals generated based on the detecting;

a step of receiving a second image generated based on the smaller number of times of scanning than the number of times of scanning at the first timing including at least one time of scanning after the first timing and scanning after the plurality of times of scanning within the first timing;

a step of training a learning device by using teacher data with the second image as an input and the first image as an output; and a step of inputting image signals obtained by the smaller number of times of scanning than the number of times of scanning at the first timing to the trained learning device to output an estimated image.

4. A system that generates an image of an object of a sample from data obtained by a charged particle beam apparatus, the system comprising:

a computer system and components executed by the computer system, wherein the computer system includes a learning device that outputs an estimated image, the learning device is trained in advance by using teacher data with a first image generated by integrating image signals obtained by a plurality of times of scanning at a first timing among the image signals obtained by performing two-dimensional scanning a plurality of times by the charged particle beam apparatus as an input, and a second image generated based on the smaller number of times of scanning than the number of times of scanning at the first timing including at least one time of scanning after the first timing and scanning after the plurality of times of scanning within the first timing as an input, and the component inputs image signals obtained by the smaller number of times of scanning than the number of times of scanning at the first timing to the trained learning device to output an estimated image.

5. The system according to claim 4, further comprising:

an input device that inputs conditions for training the learning device, wherein the input device is configured to input at least one of scanning after the first timing and scanning after a plurality of times of scanning in the scanning at the first timing, as conditions for generating the second image.

6. The system according to claim 4, wherein the first image and the second image are generated from image signals obtained based on beam scanning performed on the same pattern.

* * * * *